(12) United States Patent
Immler et al.

(10) Patent No.: US 10,498,336 B2
(45) Date of Patent: Dec. 3, 2019

(54) ELECTRONIC ASSEMBLY FOR PERIPHERAL DEVICES OF AN AIRCRAFT

(71) Applicant: Liebherr Aerospace Lindenberg GmbH, Lindenberg/Allgäu (DE)

(72) Inventors: Thomas Immler, Sigmarszell (DE); Cornelius Fink, Langen (AT)

(73) Assignee: Liebherr-Aerospace Lindenberg GmbH, Lindenberg/Allgäu (DE)

( * ) Notice: Subject to any disclaimer, the term of this patent is extended or adjusted under 35 U.S.C. 154(b) by 0 days.

(21) Appl. No.: 15/951,620

(22) Filed: Apr. 12, 2018

(65) Prior Publication Data
US 2018/0375517 A1     Dec. 27, 2018

(30) Foreign Application Priority Data
Apr. 13, 2017   (DE) .................. 10 2017 003 660

(51) Int. Cl.
| | |
|---|---|
| *H03K 19/0175* | (2006.01) |
| *B64D 43/00* | (2006.01) |
| *G01D 21/00* | (2006.01) |
| *G05B 19/042* | (2006.01) |
| *G06F 13/40* | (2006.01) |
| *G06F 17/50* | (2006.01) |
| *G01D 5/22* | (2006.01) |
| *G01R 19/25* | (2006.01) |

(52) U.S. Cl.
CPC ..... *H03K 19/017509* (2013.01); *B64D 43/00* (2013.01); *G01D 21/00* (2013.01); *G05B 19/0423* (2013.01); *G06F 13/4072* (2013.01); *G06F 17/5054* (2013.01); *G01D 5/2291* (2013.01); *G01R 19/25* (2013.01); *G05B 2219/45071* (2013.01); *G06F 17/5068* (2013.01)

(58) Field of Classification Search
None
See application file for complete search history.

(56) References Cited

U.S. PATENT DOCUMENTS

| | | | |
|---|---|---|---|
| 9,542,577 B2 * | 1/2017 | Butler | ............... H04L 67/1097 |
| 2011/0227556 A1 | 9/2011 | Ivchenko et al. | |
| 2012/0197473 A1 | 8/2012 | Kshatriya | |
| 2015/0378960 A1 | 12/2015 | Huffman | |

* cited by examiner

*Primary Examiner* — Cassandra F Cox
(74) *Attorney, Agent, or Firm* — Dilworth & Barrese, LLP

(57) ABSTRACT

The invention relates to an electronic assembly for peripheral devices such as sensors of an aircraft, comprising three generic interfaces differing from one another for coupling the assembly to at least one peripheral device and at least one digital evaluation unit, in particular arranged downstream, wherein the assembly is couplable to the peripheral device via at least one interface.

17 Claims, 2 Drawing Sheets

ELECTRONIC ASSEMBLY FOR PERIPHERAL DEVICES OF AN AIRCRAFT

BACKGROUND OF THE INVENTION

The invention relates to an electronic assembly of an electronic device which couples peripheral devices such as sensors or actuators of an aircraft. The assembly comprises three generic interfaces that differ from one another for coupling the assembly to at least one peripheral device and comprises at least one digital evaluation unit that is in particular arranged downstream, with the assembly being couplable to the peripheral device via at least one interface.

The assembly can preferably be a module that is used in a remote electronic system or is configured as part of a remote electronic system and/or is coupled to such a remote electronic system. It is furthermore conceivable that the assembly is used in a different device or in a different piece of equipment of an aircraft or as part of a corresponding piece of equipment.

Electronic remote control parts or remote electronic units (REUs) are known from the prior art that serve to enable a decentralized system architecture in aircraft, in particular in the fields of flight control and undercarriage. It is necessary here that the remote control parts or corresponding assemblies of the remote control parts can read in or control a plurality of different sensors or actuators.

The plurality of different peripheral devices has the result that a corresponding plurality of matching interfaces have to be provided, which makes the remote control parts and thus also the desired decentralized system architecture and its development expensive and complex.

In addition, the reuse of the remote control parts is very limited in a disadvantageous manner since the electronics of the remote control part is tailored to the respective application thereof and the remote control part is thus difficult to couple to other peripheral devices. Since in accordance with current concepts a dedicated interface is developed and used in dependence on the signal to be read in or to be generated, a corresponding plurality of different interfaces has to be provided to design the decentralized system architecture.

SUMMARY OF THE INVENTION

Against this background, it is the object of the invention to reduce the number of different required interfaces of a remote control part to a minimum, with the same remote control hardware simultaneously being able to be used for different functions.

This object is achieved in accordance with the intention by an electronic assembly for peripheral devices such as sensors or actuators of an aircraft having the features herein. Advantageous embodiments are also the subject herein. An assembly is accordingly provided having at least three generic interfaces differing from one another for coupling the assembly to at least one peripheral device and having at least one digital evaluation unit in particular arranged downstream. The assembly can be couplable to the peripheral device via at least one interface. Provision is made in accordance with the invention that one interface is a digital output with feedback, in particular optional feedback, one interface is an analog output and one interface is an analog input. The digital evaluation unit arranged downstream can be configured as a readjustment unit.

The possibility of reusing the remote control part or the assembly is advantageously increased by the increased flexibility provided by such an assembly and the development effort for future projects is saved.

It is conceivable in a preferred embodiment that the digital output is adapted to output signals having a variable pulse width, signals having a variable frequency and/or signals for exciting sensors and/or to carry out a feedback of signals for a switching state verification and/or to be used as a digital input on a feedback of signals. The digital output can thus be configured in a preferred embodiment such that it can also act as a digital input.

It is conceivable in a further preferred embodiment that the analog output is adapted to output a signal having a variable voltage and/or frequency and/or signal shape. The signal shape can here preferably comprise a sinusoidal signal, a rectangular signal, or other signal shapes.

It is conceivable in a further preferred embodiment that the analog input is adapted to carry out a current measurement, a voltage measurement, a frequency measurement, a resistance measurement and/or a digital status measurement.

It is furthermore conceivable in a further preferred embodiment that the peripheral device is an LVDT, i.e. a linear variable differential transformer, an RVDT, i.e. a rotary variable differential transformer, a resolver or an angular position generator, a passive inductive proximity sensor, a servo valve, a potentiometer, a solenoid valve, an analog sensor, a temperature sensor and/or a pressure sensor. Provision can be made there that only one respective single peripheral device or also more than one single peripheral device is couplable to the assembly. It is conceivable in a further preferred embodiment that the digital the evaluation unit is an FPGA or a microcontroller.

Provision can be made in a further preferred embodiment that the LVDT, the resolver, the passive inductive proximity sensor and/or the servo valve are couplable to the assembly via the analog output and the analog input. Provision can alternatively be made that the servo valve is only couplable to the assembly via the analog output. Provision can be made that the digital output here is not used for coupling the assembly to said peripheral devices.

Provision can be made in a further preferred embodiment that the passive inductive proximity sensor, the analog sensor and/or the temperature sensor are couplable to the assembly via the digital output and the analog input. Provision can be made there that the analog output is not used for coupling said peripheral devices.

Provision can be made in a further preferred embodiment that the assembly is configurable via pin programming.

Provision can be made in a further embodiment that the analog output comprises a low pass filter and/or an amplifier and/or that the digital evaluation unit comprises a PDM modulator.

BRIEF DESCRIPTION OF THE DRAWINGS

Further details and advantages of the invention are explained with reference to the embodiments shown in the Figures. There are shown.

DESCRIPTION OF THE PREFERRED EMBODIMENTS

Figure 1:
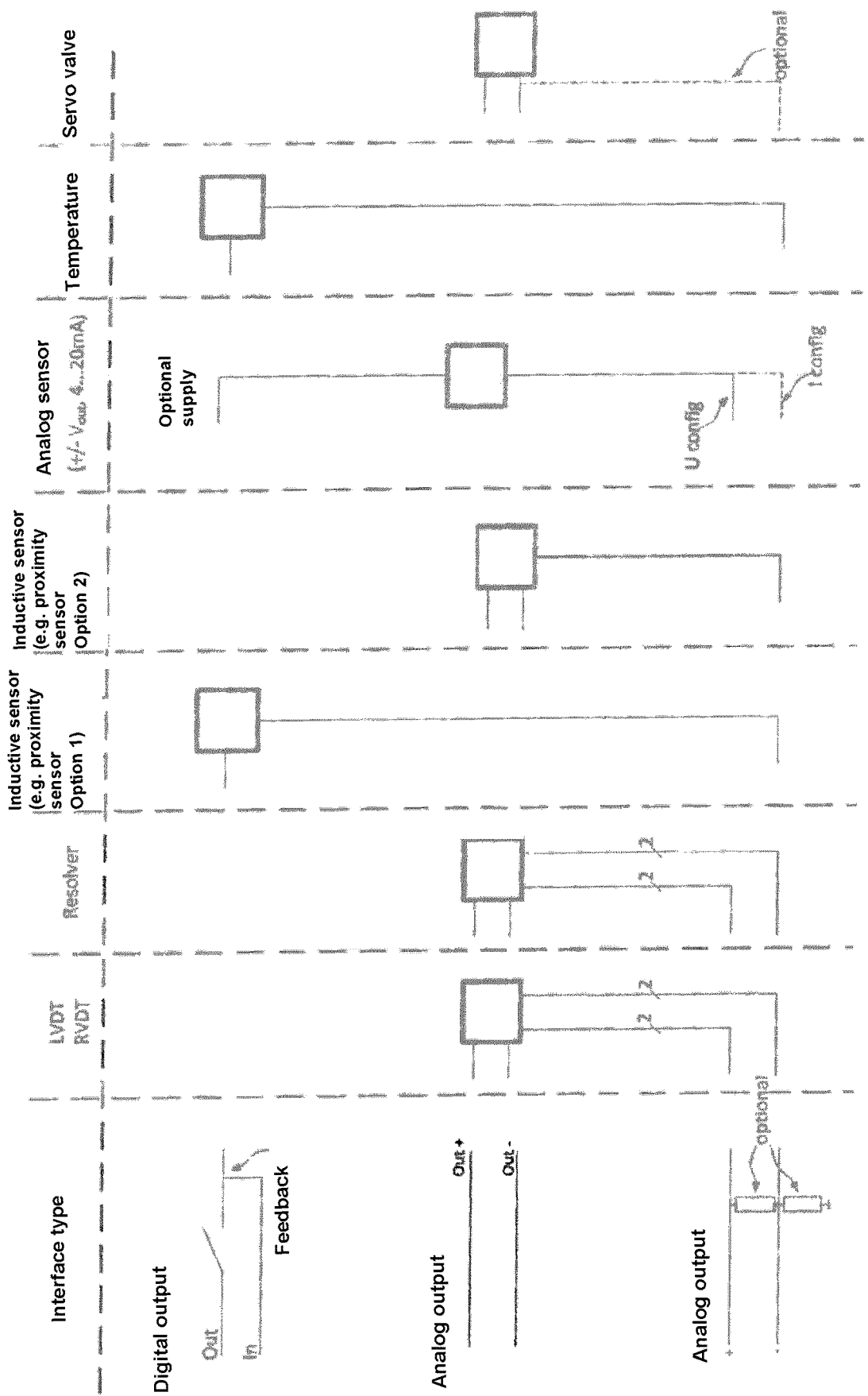
FIG. 1: a schematic view of the possibilities of coupling the assembly in accordance with the invention to different peripheral devices.

FIG. 1 shows the three interfaces of the assembly shown schematically and differing from one another in the left region. Likewise schematically different peripheral devices are indicated to the right thereof.

The peripheral devices can be sensors or actuators of the aircraft that are, for example, couplable to an onboard computer of the aircraft via the assembly.

How each peripheral device is couplable to the assembly is indicated for each peripheral device by a corresponding vertical positioning of its coupling points in the region of the digital output, the analog output and/or the analog input.

The peripheral devices in the embodiment of FIG. 1 are predominantly coupled to the assembly via respectively exactly two of the three interfaces. As shown in the right region of FIG. 1, the servo valve described by way of example can be coupled to the assembly solely via the analog output. There is optionally the possibility of coupling the servo valve to the assembly both via the analog output and via the analog input. Other peripheral devices can be couplable to the assembly via exactly two of the three interfaces.

Provision can be made on a coupling of the assembly in accordance with the invention to an analog sensor that the analog sensor is supplied via the digital output. Depending on whether a voltage or a current of the analog sensor is to be detected, the analog sensor can be connectable to different poles of the analog input.

It is possible by the use of only three different generic interfaces and of a digital evaluation arranged downstream by means of an evaluation unit 7 or a readjustment unit 7 to read in and evaluate a plurality of the most varied sensors and/or to control electronic control elements and actuators. The association of a function such as an LVDT evaluation with the generic interfaces can take place via an FTGA or a microcontroller.

The FTGA or microcontroller can be used in conjunction with the above-named interfaces as a universally usable evaluation and control unit through predefined functions and simple configurations, for example via PIN programming.

A universally usable remote electronic data concentrator can be configured by means of the invention described here. A further exemplary embodiment comprises the implementation of the invention with a flight control computer that evaluates one or more sensors such as resolvers, RVDTs, potentiometers, temperature sensors, inductive proximity sensors with the aid of the described interfaces.

Another possible embodiment comprises the evaluation of passive inductive proximity sensors for aerospace applications using the invention described here. Another possible embodiment comprises the control of servo valves using the universal interfaces described here.

Figure 2:
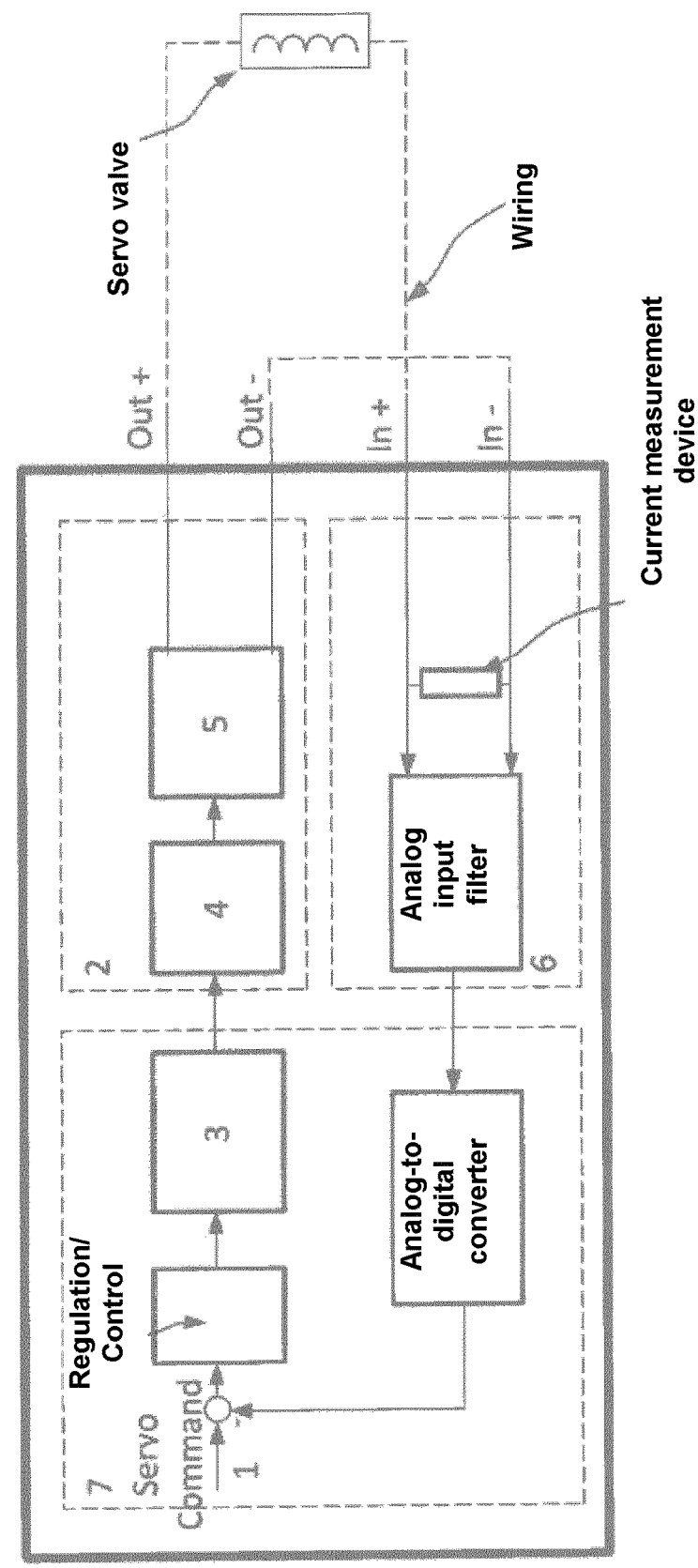
FIG. 2: a schematic view of the coupling of the assembly with in accordance with the invention to a servo valve.

As shown in FIG. 2, the analog output 2 can generate a differential voltage that is variable with respect to frequency and amplitude. A signal modulated with high frequency PDM (pulse density modulation) can here be generated by means of a corresponding PDM modulator 3 that can be low pass filtered and amplified. A desired signal shape can hereby be reconstructed. The current through the connected valve can be determined by a current measurement and the commanded current 1 can be set by means of a readjustment unit or evaluation unit 7 of the PDM signal.

The analog output 2 can comprise at least one filter 4 connected, in particular in series, to at least one amplifier 5. The analog input 6 can comprise an analog input filter that can be switched, in particular parallel, with a current measuring device.

The adjustment unit 7 or the evaluation unit 7 can comprise a regulation/control which can be connected in series to the PDM modulator 3. The readjustment unit 7 can furthermore be coupled to the analog input 6 via an analog-to-digital converter.

The universal use capability of the apparatus in accordance with the invention in conjunction with different peripheral devices results as an advantage of said apparatus. The assembly can here also be reused more simply with different peripheral devices.

A reduction of the number and complexity of the hardware components furthermore results, which produces corresponding advantages in cost and weight.

A reduction of the number of different required interfaces results overall for the system of the aircraft by a use of three generic interfaces. This likewise results in corresponding cost reductions.

Depending on the design of the assembly, reduced space requirements of the apparatus can furthermore be achieved and the development effort for the development of new peripheral devices controllable or connectable by means of the assembly can be reduced by the restriction to three interfaces.

The invention claimed is:

1. An electronic assembly for peripheral devices such as sensors and/or actuators of an aircraft comprising at least three generic interfaces differing from one another for coupling the assembly to at least one peripheral device and at least one digital evaluation unit, in particular arranged downstream, wherein the assembly is couplable to the peripheral device via at least one interface;
one interface is a digital output with feedback, in particular optional feedback;
one interface is an analog output;
one interface is an analog input;
the digital evaluation unit is an FPGA or a microcontroller; and
the peripheral device is an LVDT, an RVDT, a resolver, a passive inductive proximity sensor, a servo valve, a potentiometer, a solenoid valve, an analog sensor, a temperature sensor and/or a pressure sensor.

2. An electronic assembly in accordance with claim 1, wherein the analog output is adapted to output a signal having a variable voltage and/or frequency and/or signal shape.

3. An electronic assembly in accordance with claim 1, wherein the LVDT, the resolver, the passive inductive proximity sensor and/or the servo valve are couplable to the assembly via the analog output and the analog input; or in that the servo valve is only couplable to the assembly via the analog output.

4. An electronic assembly in accordance with claim 1, wherein the passive inductive proximity sensor, the analog sensor and/or the temperature sensor are couplable to the assembly via the digital output and the analog input.

5. An electronic assembly in accordance with claim 1, wherein the assembly is configurable via pin programming.

6. An electronic assembly in accordance with claim 1, wherein the analog output comprises a low pass filter and/or an amplifier; and/or in that the digital evaluation unit comprises a PDM modulator.

7. An electronic assembly in accordance with claim 2, wherein the analog input is adapted to carry out a current measurement, a voltage measurement, a frequency measurement, a resistance measurement and/or a digital status measurement.

8. An electronic assembly for peripheral devices such as sensors and/or actuators of an aircraft comprising at least three generic interfaces differing from one another for coupling the assembly to at least one peripheral device and at least one digital evaluation unit, in particular arranged downstream, wherein the assembly is couplable to the peripheral device via at least one interface;

one interface is a digital output with feedback, in particular optional feedback;

one interface is an analog output;

one interface is an analog input;

the digital evaluation unit is an FPGA or a microcontroller; and the digital output is adapted to output signals having a variable pulse width, signals having a variable frequency and/or signals for exciting sensors and/or to carry out a feedback of signals for a switching state verification and/or to be used as a digital input on a feedback of signals.

9. An electronic assembly in accordance with claim 8, wherein the analog output is adapted to output a signal having a variable voltage and/or frequency and/or signal shape.

10. An electronic assembly in accordance with claim 9, wherein the analog input is adapted to carry out a current measurement, a voltage measurement, a frequency measurement, a resistance measurement and/or a digital status measurement.

11. An electronic assembly in accordance with claim 10, wherein the peripheral device is an LVDT, an RVDT, a resolver, a passive inductive proximity sensor, a servo valve, a potentiometer, a solenoid valve, an analog sensor, a temperature sensor and/or a pressure sensor.

12. An electronic assembly in accordance with claim 9, wherein the peripheral device is an LVDT, an RVDT, a resolver, a passive inductive proximity sensor, a servo valve, a potentiometer, a solenoid valve, an analog sensor, a temperature sensor and/or a pressure sensor.

13. An electronic assembly in accordance with claim 8, wherein the analog input is adapted to carry out a current measurement, a voltage measurement, a frequency measurement, a resistance measurement and/or a digital status measurement.

14. An electronic assembly in accordance with claim 13, wherein the peripheral device is an LVDT, an RVDT, a resolver, a passive inductive proximity sensor, a servo valve, a potentiometer, a solenoid valve, an analog sensor, a temperature sensor and/or a pressure sensor.

15. An electronic assembly in accordance with claim 8, wherein the peripheral device is an LVDT, an RVDT, a resolver, a passive inductive proximity sensor, a servo valve, a potentiometer, a solenoid valve, an analog sensor, a temperature sensor and/or a pressure sensor.

16. An electronic assembly for peripheral devices such as sensors and/or actuators of an aircraft comprising at least three generic interfaces differing from one another for coupling the assembly to at least one peripheral device and at least one digital evaluation unit, in particular arranged downstream, wherein the assembly is couplable to the peripheral device via at least one interface;

one interface is a digital output with feedback, in particular optional feedback;

one interface is an analog output, one interface is an analog input;

the digital evaluation unit is an FPGA or a microcontroller; and the analog input is adapted to carry out a current measurement, a voltage measurement, a frequency measurement, a resistance measurement and/or a digital status measurement.

17. An electronic assembly in accordance with claim 16, wherein the peripheral device is an LVDT, an RVDT, a resolver, a passive inductive proximity sensor, a servo valve, a potentiometer, a solenoid valve, an analog sensor, a temperature sensor and/or a pressure sensor.

* * * * *